United States Patent [19]
Kim et al.

[11] Patent Number: 6,026,763
[45] Date of Patent: Feb. 22, 2000

[54] THIN-FILM DEPOSITION APPARATUS USING CATHODIC ARC DISCHARGE

[75] Inventors: Jong-kuk Kim, Suwon; Seung-ho Nam, Seongnam; Byong-lyong Choi, Seoul, all of Rep. of Korea

[73] Assignee: Samsung Electronics Co., Ltd., Rep. of Korea

[21] Appl. No.: 08/979,115

[22] Filed: Nov. 26, 1997

[30] Foreign Application Priority Data

Mar. 31, 1997 [KR] Rep. of Korea ................. 97-11833

[51] Int. Cl.⁷ ................................................. C23C 22/00
[52] U.S. Cl. ........................... 118/723 HC; 118/723 VE; 204/298.41
[58] Field of Search ............... 118/723 HC, 723 VE; 204/192.38, 298.03, 298.41; 427/580; 250/426

[56] References Cited

U.S. PATENT DOCUMENTS 5,476,691 12/1995 Komvopoulos et al. .
5,480,527 1/1996 Welty .

Primary Examiner—Deborah Yee
Attorney, Agent, or Firm—Burns, Doane, Swecker & Mathis, L.L.P.

[57] ABSTRACT

A thin-film deposition apparatus includes an arc vaporization portion from which charged particles of a deposition material are generated by a cathodic arc discharge, a plasma duct having a bend and guiding the charged particles from the arc vaporization portion to a substrate, a magnetic field generator for generating magnetic fields to direct the charged particles from the arc vaporization portion to the substrate, and a reflective magnetic field source installed in a convex portion of the bend of the plasma duct, for generating magnetic fields that interfere with the magnetic fields formed by the magnetic field generator so that magnetic flux lines are distributed along the plasma duct.

8 Claims, 5 Drawing Sheets

THIN-FILM DEPOSITION APPARATUS USING CATHODIC ARC DISCHARGE

BACKGROUND OF THE INVENTION

1. Field of the Invention

The present invention relates to a thin-film deposition apparatus using a cathodic arc discharge, and more particularly, to a thin-film deposition apparatus using a cathodic arc discharge, which evaporates an arc vapor material from a target and guides the evaporated material to be deposited on a substrate.

2. Description of the Related Art

Generally, an arc coating method, which is a physical vapor deposition method of a vacuum coating method, is to coat a thin film such that a plasma duct is fixed at the front end of a target, and charged particles generated by an arc discharge, i.e., plasma, are transferred from the target to a substrate to be coated. The arc coating method is applied to manufacture of general cutting tools, molds and semiconductor devices. For such application, a thin-film deposition apparatus has been developed, which prevents macroparticles, i.e., a lump of neutral particles of a target material, which deteriorate the quality of the thin film generated by the arc coating method, from landing on the substrate.

Referring to FIG. 1, a conventional serial thin-film deposition apparatus using a cathodic arc discharge includes a target 5 from which arc vapor materials are generated, a plasma duct 8 provided in front of the target 5, and a cylindrical electromagnet 1 for guiding the arc vapor materials generated from the target 5 so that the arc vapor materials may be deposited on a substrate 6 facing the target 5.

Among the arc vapor materials, i.e., electrons, target ions, neutral particles, macroparticles and charged macroparticles, generated from the target 5, the charged particles such as the electrons, target ions or charged macroparticles migrate along a magnetic flux line 7 by the electromagnet 1 to then be deposited on the substrate 6. Parts of the macroparticles and the neutral particles are ionized by a high-density plasma (electrons and ions) at the center of the electromagnet 1 to then be deposited on the substrate 6, and the remaining parts thereof stick to the inner wall of the plasma duct 8.

However, in the aforementioned thin-film deposition apparatus, since the target 5 and the substrate 6 face each other, parts of non-ionized macroparticles may be deposited on the substrate 6, which deteriorates the quality of the thin film.

To solve this problem, a rectangular thin-film deposition apparatus has been proposed, in which a plasma duct is bent and a magnetic field is distributed along the plasma duct. Referring to FIG. 2, the rectangular thin-film deposition apparatus includes a target 33 from which arc vapor materials are generated, a trigger electrode 35 contacting the target 33 in a state where a negative voltage is applied to the target 33, a plasma duct 39 having a bend of approximately 90°, a first electromagnet 46 disposed at the outer portion of the plasma duct 39 where the target 33 is installed, a second electromagnet 48 disposed at the bend of the plasma duct 39, and a third electromagnet 50 wrapped around at the end portion of the plasma duct 39.

In a state in which a voltage is applied to the target 33, if the trigger electrode 35 contacts the target 33, an arc is instantaneously generated, and arc vapor materials are generated while the generated arc stays on the target 33 for a predetermined time.

If currents are applied to the first, second and third electromagnets 46, 48 and 50, as shown in FIG. 3, magnetic flux is generated, shown by flux lines 40 distributed along the plasma duct 39. Thus, among the arc vapor materials generated from the target 33 (FIG. 2), charged particles are deposited on a substrate (not shown) along the magnetic flux lines 40. Also, parts of the neutral particles and macroparticles ionized by the high-density plasma are deposited to the substrate along the magnetic flux lines 40. Non-ionized neutral particles and macroparticles cannot reach the substrate and stick to the plasma duct 39 and a baffle 52 disposed at the inside wall of the plasma duct 39. That is to say, while most of the macroparticles travels around the plasma duct 39, they stick to the inner wall of the plasma duct 39 and the baffle 52 to then be removed.

In the above-described rectangular thin-film deposition apparatus, the magnetic flux lines 40 extend outward from inside the plasma duct 39 at the bend of the plasma duct 39. Thus, some of the charged particles migrating along the magnetic flux lines 40 collide on the inner wall of the bend, and vanish, thereby deteriorating the deposition efficiency of the thin film.

SUMMARY OF THE INVENTION

To solve the above problems, it is an object of the present invention to provide a thin-film deposition apparatus using a cathodic arc discharge, having a reflective magnetic field source, by which magnetic flux lines are distributed along a plasma duct.

To accomplish the above object, there is provided a thin-film deposition apparatus comprising an arc vaporization portion from which charged particles of a deposition material are generated by a cathodic arc discharge, a plasma duct having a bend and guiding the charged particles from the arc vaporization portion to a substrate, a magnetic field generator for generating magnetic fields to direct the charged particles from the arc vaporization portion to the substrate, and a reflective magnetic field source installed in a convex portion of the bend of the plasma duct, for generating magnetic fields that interfere with the magnetic fields formed by the magnetic field generator so that magnetic flux lines are distributed along the plasma duct.

Here, the magnetic field generator comprises first and second magnetic field sources, installed near the arc vaporization portion and the substrate to surround the plasma duct, respectively, and an inductive magnetic field source provided near the bend of the plasma duct and diverting the charged particles.

Also, the arc vaporization portion comprises a target coupled to a cathode body, a trigger electrode selectively contacting the target, to thereby initiate an arc discharge, an arc discharge restraining ring installed at the outer circumference of the target, for restraining the generated arc discharge, a first arc controller installed in the cathode body so that the position thereof can be changed with respect to the arc generating surface of the target, for controlling the migration of the arc, and a second arc controller of a ring-shape, installed at the outer circumference of the cathode body.

BRIEF DESCRIPTION OF THE DRAWINGS

The above objects and advantages of the present invention will become more apparent by describing in detail a preferred embodiment thereof with reference to the attached drawings in which.

DESCRIPTION OF THE PREFERRED EMBODIMENT(S)

Figure 1:
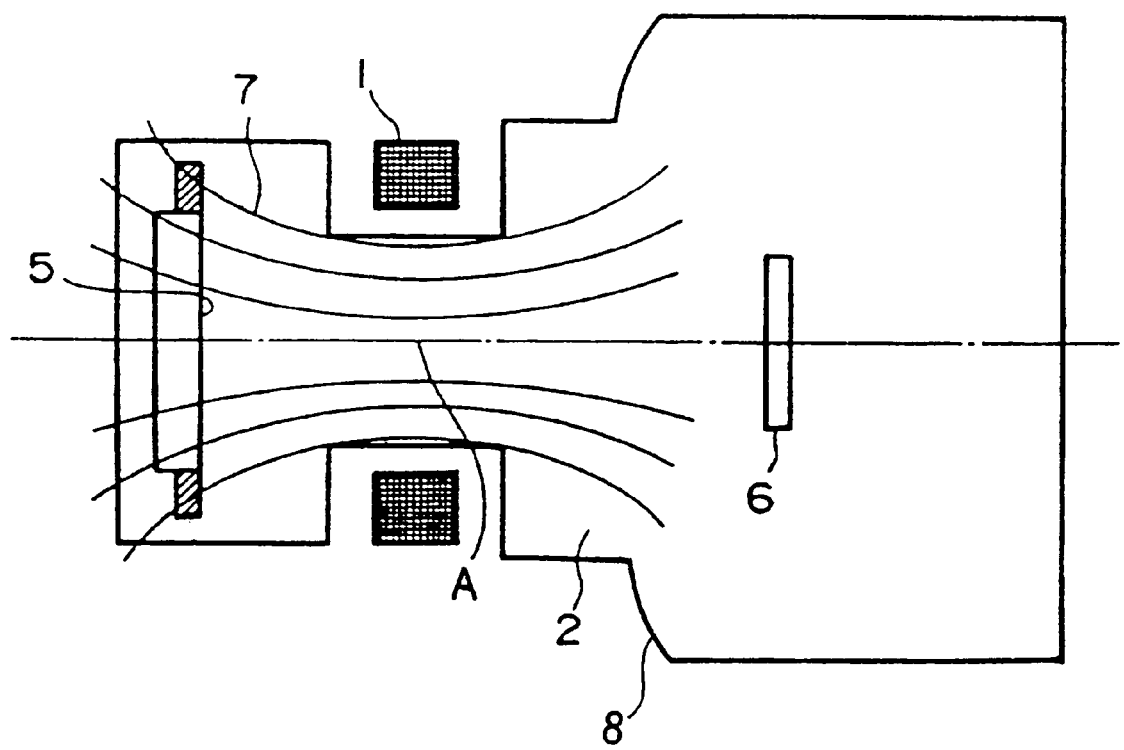
FIG. 1 is a schematic cross section view of a conventional serial thin-film deposition apparatus using a cathodic arc discharge.
Figure 2:
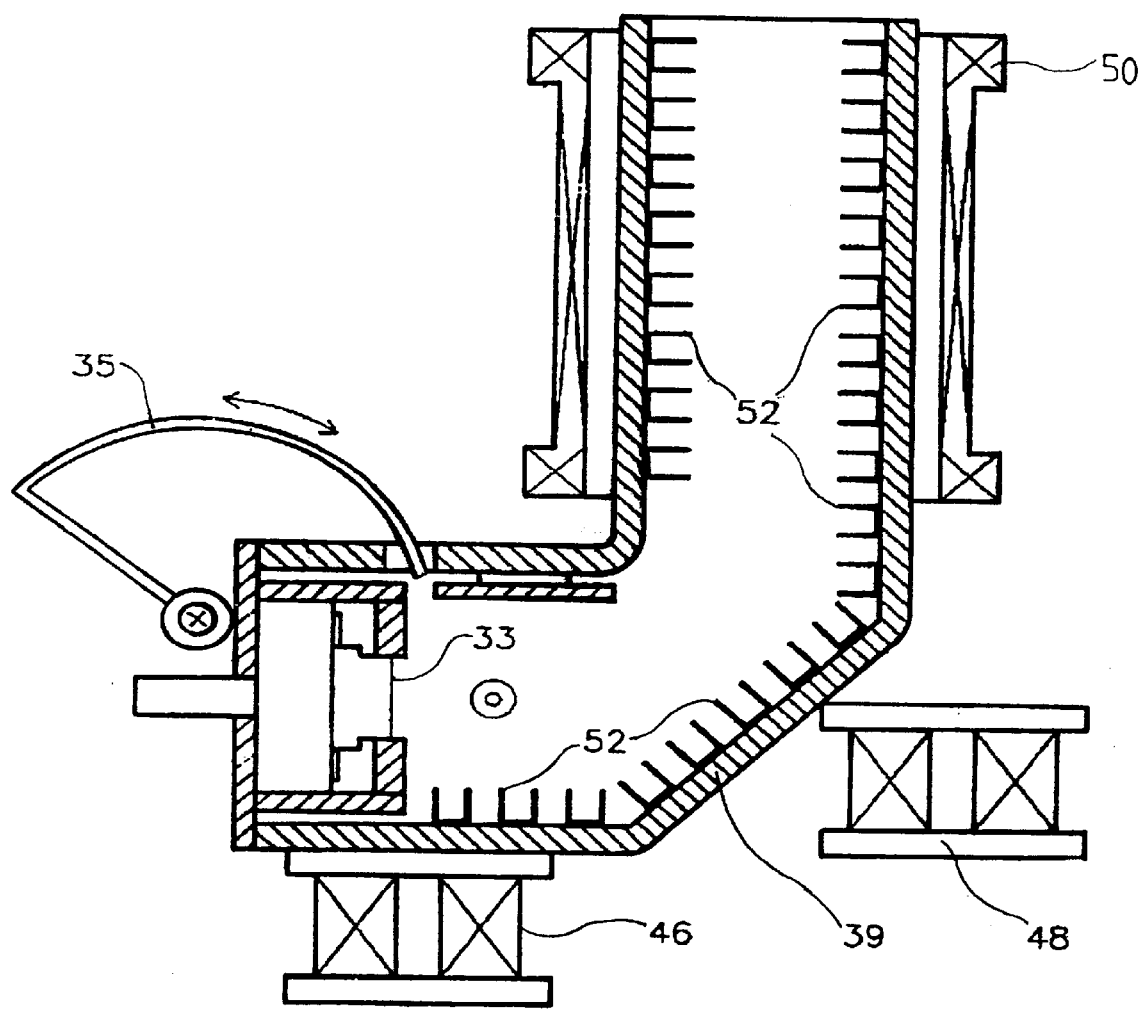
FIG. 2 is a schematic cross section view of a conventional rectangular thin-film deposition apparatus using a cathodic arc discharge.
Figure 3:
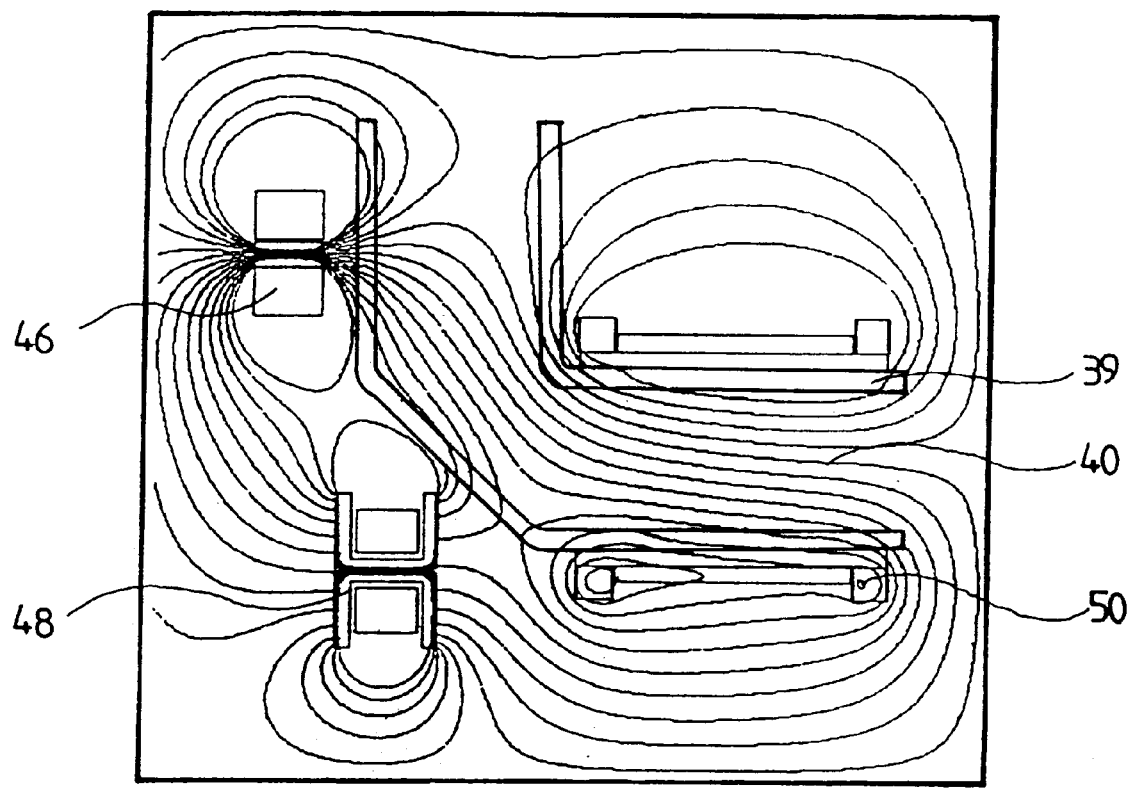
FIG. 3 schematically illustrates the distribution of magnetic fields shown in FIG. 2.
Figure 4:
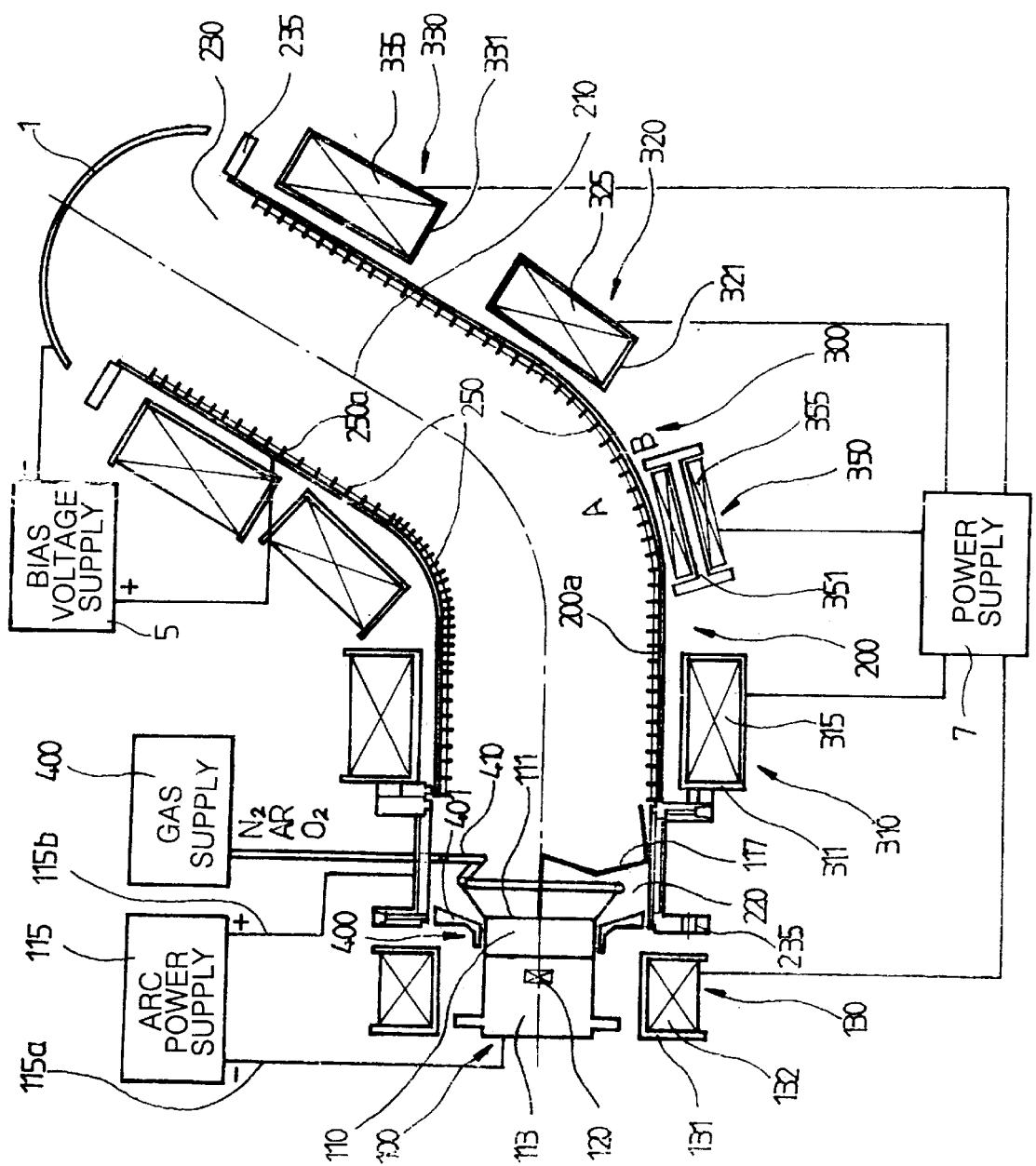
FIG. 4 is a schematic illustration of a thin-film deposition apparatus using a cathodic arc discharge according to the present invention.

As shown in FIG. 4, the thin-film deposition apparatus using a cathodic arc discharge according to the present invention includes an arc vaporization portion 100 from which charged particles of a deposition material is generated by the cathodic arc discharge, a plasma duct 200 having a bend and guiding the charged particles from the arc vaporization portion 100 to a substrate 1, and a magnetic field generator for generating magnetic fields to migrate the charged particles to the substrate 1.

The arc vaporization portion 100 includes a target 110 coupled to a cathode body 113, a trigger electrode 117, selectively contacting the target 110, for generating an arc, an arc discharge restraining ring 400 installed at the outer circumference of the target 110, for restraining an arc discharge, and first and second arc controllers 120 and 130 for controlling the migration of the arc in an arc generating surface 111 of the target 110.

The cathode body 113 is connected to a negative electrode 115a of an arc power supply 115 from which a negative voltage of 0~100 V with a current of approximately 0~300 A is supplied, and the target 110 is electrically connected to the cathode body 113. When a negative voltage is applied to the target 110, the trigger electrode 117 pivotably installed at one side of the plasma duct 200 makes contact with the target 110 and then loses contact therewith, so that an arc discharge occurs. Accordingly, arc vapor materials, e.g., charged particles, are generated from the surface of the target 110, i.e., from the arc generating surface 111. Also, a cooling unit (not shown) for cooling the target 110 in the course of generating the charged particles, is preferably provided.

The arc discharge restraining ring 400 is made of a ring-shaped magnetic material. A protrusion 141 for preventing leakage of charged particles is formed at an angle of approximately 0~90° with respect to the arc generating surface 111. The angle between the protrusion 141 and the arc generating surface 111 may vary according to the kind of target materials.

The first arc controller 120, disposed to the rear of the target 110 in the cathode body 113, controls the movement of the arc generated from the arc generating surface 111 of the target 110. Preferably, the first arc controller 120 is installed to be able to change its position with respect to the arc generating surface 111 of the target 110 according to the kind of target materials. The first arc controller 120 may be either permanent magnet or electromagnet. Specifically, the permanent magnet is more preferably used as the first arc controller 120 because it does not exert a thermal effect on the target 110.

The second arc controller 130 is installed at the outer circumference of the cathode body 113 in a ring shape. The second arc controller 130 is an electromagnet in which the intensity of magnetic fields can be adjusted to control the movement of the arc generated from the arc generating surface 111, and is composed of a cylindrical member 131 and a coil 132 wound around the cylindrical member 131. Alternatively, the second arc controller 130 may be a permanent magnet.

The plasma duct 200 is bent at an angle (θ) of approximately 30~120°, preferably 60° with respect to a central line A of the target 110.

Here, linear sections L1 and L2 of the plasma duct 200 have an enough length to have the neutral particles and macroparticles, which are not affected by the magnetic field, adsorbed into the inner wall 200a of the plasma duct 200, while they travel from the target 110 to the substrate 1, to then be removed before they reach the substrate 1. To facilitate the adsorption of the neutral particles and macroparticles, a baffle 250 is formed on the inner wall of the plasma duct 200. The baffle 250 is composed of a plurality of plates extended from the inner wall 200a of the plasma duct 200. Alternatively, the baffle 250 may be continuously formed in the form of spirals.

Also, the plasma duct 200 is connected to a positive electrode 115b of the arc power supply 115, and a voltage higher than that of the target 110 is applied thereto. A flange 235 is formed at each end of the plasma duct 200. Thus, the plasma duct 200 may be coupled to a vacuum chamber by screw-coupling the flange 235 to the vacuum chamber.

The magnetic field generator includes first and second magnetic field sources 310 and 330, each installed around the target 110 and substrate 1 to surround the plasma duct 200, and an inductive magnetic field source 320 provided near the bend of the plasma duct 200. Also, the apparatus of the present invention includes a reflective magnetic field source 350 for interfering with the magnetic fields formed by the first and second magnetic field sources 310 and 330 and the inductive magnetic field source 320.

The first magnetic field source 310 guides charged particles generated from the arc generating surface 111 to travel along the linear section L1 of the plasma duct 200. The inductive magnetic field source 320 diverts the charged particles so that the charged particles do not collide against the inner wall 200a of the plasma duct 200 at the bend. Also, the second magnetic field source 330 guides the charged particles having passed through the bend to travel toward the substrate 1 along the linear section L2.

Figure 5:
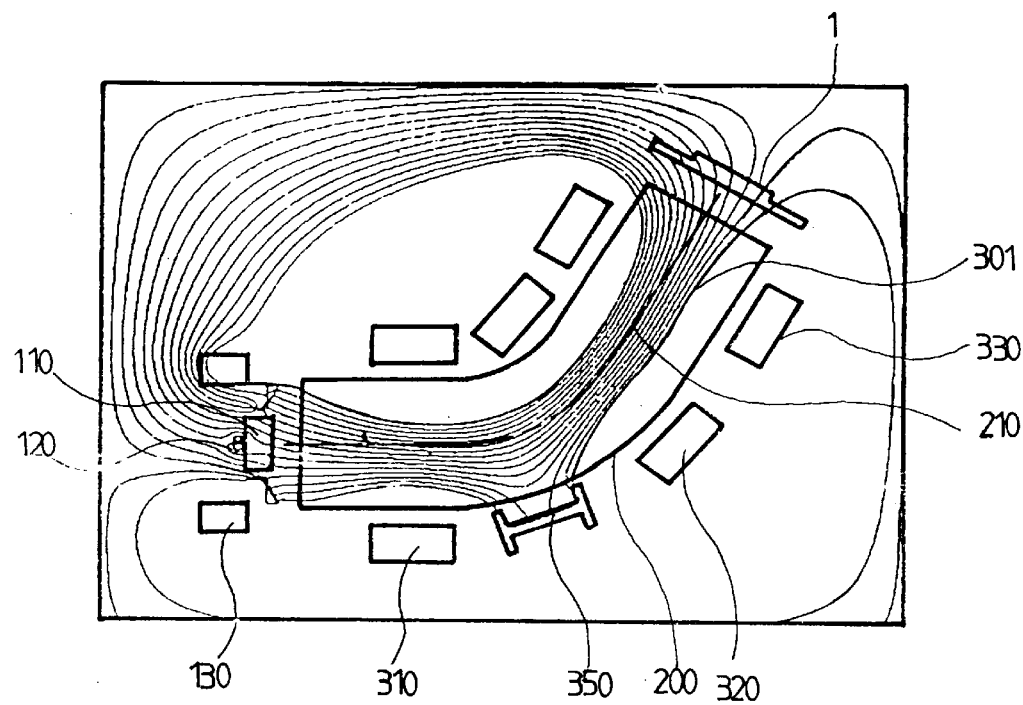
FIG. 5 illustrates the distribution of magnetic fields when no current is applied to a reflective magnetic field source shown in FIG. 4.

Each of the first and second magnetic field sources 310 and 330 and the inductive magnetic field source 320 is an electromagnet which can adjust the magnetic field using currents, and is composed of cylindrical members 311, 331 and 321 surrounding the plasma duct 200 and coils 315, 335 and 325 wound around the cylindrical members 311, 331 and 321, respectively. Alternatively, the first and second magnetic field sources 310 and 330 and the inductive magnetic field source 320 may be permanent magnets. The magnetic fields produced by the first and second magnetic field sources 310 and 330 and the inductive magnetic field source 320 are distributed as shown in FIG. 5.

Figure 6:
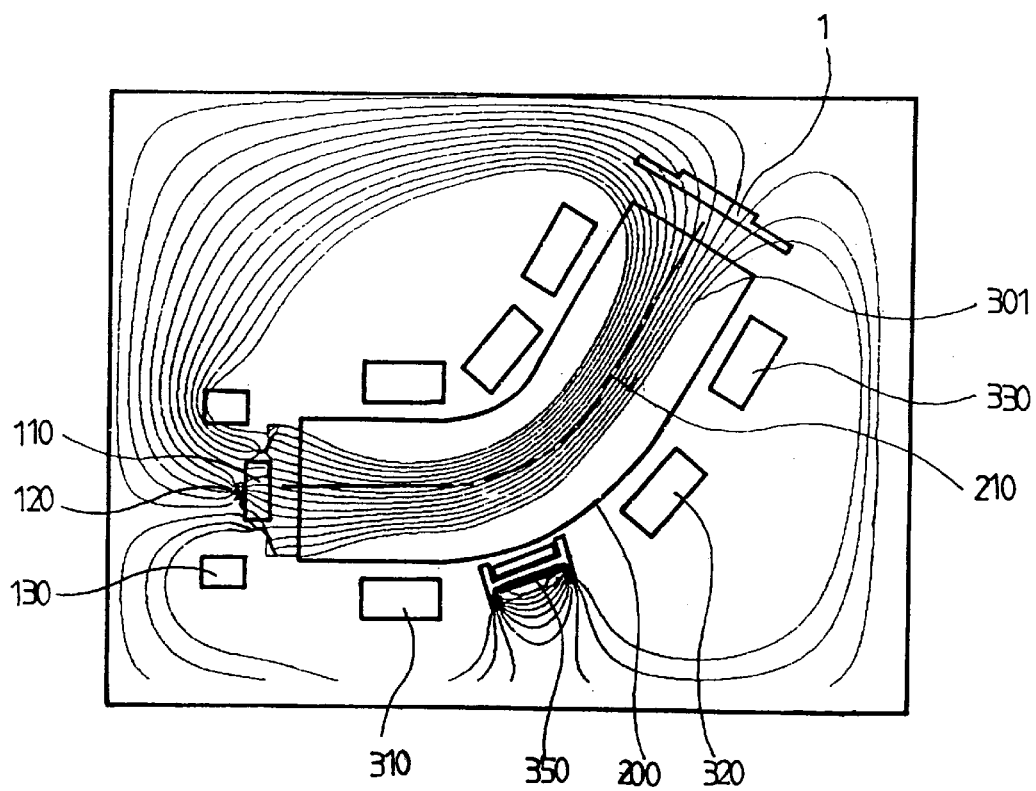
FIG. 6 illustrates the distribution of magnetic fields when current is applied to a reflective magnetic field source shown in FIG. 4.

The reflective magnetic field source 350 is provided at an exterior area of the bend, that is, in the convex portion of the bend. If a current is applied to the reflective magnetic field source 350, the reflective magnetic field source 350 produces magnetic fields repellent against the magnetic fields produced by the first and second magnetic fields 310 and 330 and the inductive magnetic field source 320 so that the magnetic flux lines 310 are distributed along the plasma duct 200, as shown in FIG. 6. The reflective magnetic field source 350 is an electromagnet for forming the magnetic fields according to the applied currents and is composed of a yoke 351 as a magnetic body having a flange at both its ends, and a coil 355 wound around the yoke 351. Here, the reflective magnetic field source 350 is disposed at a predetermined angle with respect to the arc generating surface 111 of the target 110.

The power supply 7 supplies currents independently to the first and second magnetic field sources 310 and 330, the inductive magnetic field source 320, the reflective magnetic field source 350 and the second arc controller 130.

The substrate 1 is electrically connected to the negative electrode of a bias voltage supply 5, and a negative voltage of about 0~1000 V is applied thereto.

Also, according to the thin-film deposition apparatus of the present invention, a gas such as $N_2$, Ar or $O_2$ is supplied to the plasma duct 200 through a gas tube 510 by a gas supply 500. The gas tube 510 extends to the front part of the target 110. The supplied gas is jetted from the front part of the target 110 toward the arc generating surface 111. The gas supplied into the plasma duct 200 is used for generating charged compound particles. For example, in the case that the target 110 is made of Ti, the charged TiN particles are formed when the $N_2$ gas is supplied from the gas supply 500 by an arc discharge in the arc generating surface 111 of the target 110. The generated charged TiN particles are guided by the magnetic field generator and deposited on the substrate 1.

Now, the operation of the aforementioned thin-film deposition apparatus using a cathodic arc discharge according to the present invention will be described in more detail. When a negative voltage is applied to the target 110 shown in FIG. 4, an arc discharge occurs while the trigger electrode 117 makes contact with the target 110 and then loses contact therewith. The generated arc is restrained on the arc generating surface 111 of the target 110 by the arc discharge restraining ring 400 and the magnetic fields generated by the first and second arc controllers 120 and 130, thereby generating charged particles. At this time, if a current of triangular or sinusoidal waves is supplied to the second arc controller 130, the arc generates uniform charged particles, i.e., ions of the target material, electrons and charged particles, while traveling throughout the arc generating surface 111.

The charged particles guided by the first magnetic field source 310 travel along the linear section L1 of the plasma duct 200, and is diverted at the bend of the plasma duct 200 by the inductive magnetic field source 320 and is controlled by the second magnetic field source 330. Then, the charged particles are deposited on the substrate 1.

Some of the macroparticles and neutral particles generated from the arc generating surface 111 together with the charged particles are ionized within the plasma duct 200 by collision with charged particles to then be deposited on the substrate 1 in the same process as that for the charged particles.

Also, uncharged neutral particles and macroparticles unaffected by the magnetic fields move linearly and stick to the inner wall 200a or baffle 250 near the bend to then be removed. Thus, few neutral particles and macroparticles reach the substrate 1.

In this case, the reflective magnetic field source 350, as shown in FIG. 6, pushes the magnetic flux lines 310 of the first magnetic field source 310 and the inductive magnetic field source 320 in the bend of the plasma duct 200 so that the magnetic flux lines 310 are distributed along the plasma duct 200, thereby enhancing the transfer rate of the charged particles.

Also, when a compound is to be coated on the substrate 1, a predetermined gas is supplied from the gas supply 500 and an arc discharge is made to occur in the arc generating surface 111 of the target 110, thereby producing charged compound particles. The produced charged compound particles are guided by the magnetic field generator to be deposited on the substrate 1.

As described above, according to the thin-film deposition apparatus using a cathodic arc discharge of the present invention, a reflected magnetic field source is provided in the bend of a plasma duct so that magnetic flux lines are distributed along the plasma duct. Therefore, charged particles can reach a substrate without colliding against the inner wall of the plasma duct, thereby improving thin-film deposition efficiency.

What is claimed is:

1. A thin-film deposition apparatus comprising:

an arc vaporization portion from which charged particles of a deposition material are generated by a cathodic arc discharge;

a plasma duct having a bend and guiding the charged particles from the arc vaporization portion to a substrate;

a magnetic field generator for generating magnetic fields to direct the charged particles from the arc vaporization portion to the substrate; and a reflective magnetic field source installed in a convex portion of the bend of the plasma duct, for generating magnetic fields that interfere with the magnetic fields formed by the magnetic field generator so that magnetic flux lines are distributed along the plasma duct.

2. The thin-film deposition apparatus according to claim 1, wherein the magnetic field generator comprises:

first and second magnetic field sources, installed near the arc vaporization portion and the substrate to surround the plasma duct, respectively; and an inductive magnetic field source provided near the bend of the plasma duct and diverting the charged particles.

3. The thin-film deposition apparatus according to claim 1, wherein the arc vaporization portion comprises:

a target coupled to a cathode body;

a trigger electrode selectively contacting the target, to thereby initiate an arc discharge;

an arc discharge restraining ring installed at the outer circumference of the target, for restraining the generated arc discharge;

a first arc controller installed in the cathode body so that the position thereof can be changed with respect to the arc generating surface of the target, for controlling the migration of the arc; and a second arc controller of a ring-shape, installed at the outer circumference of the cathode body.

4. The thin-film deposition apparatus according to claim 3, wherein the arc discharge restraining ring is made of a magnetic material, and has a protrusion formed at an angle of approximately 0~90° with respect to the arc generating surface, for preventing leakage of charged particles.

5. The thin-film deposition apparatus according to claim 1, wherein the plasma duct is bent at an angle of 30~120°.

6. The thin-film deposition apparatus according to claim 1, wherein a baffle is formed at the inner wall of the plasma duct to protrude therefrom.

7. The thin-film deposition apparatus according to claim 6, wherein the baffle is continuously formed in the form of spirals.

8. The thin-film deposition apparatus according to claim 1, wherein the reflective magnetic field source is an electromagnet having a yoke which is made of a magnetic material and a coil wound around the yoke.

* * * * *